(12) United States Patent
Damaraju et al.

(10) Patent No.: US 9,436,235 B2
(45) Date of Patent: Sep. 6, 2016

(54) HEAT SINK WITH AN INTEGRATED VAPOR CHAMBER

(71) Applicant: NVIDIA Corporation, Santa Clara, CA (US)

(72) Inventors: Srinivasa Rao Damaraju, San Jose, CA (US); Joseph Walters, Campbell, CA (US); Dalton Seth O'Connor, Santa Clara, CA (US)

(73) Assignee: NVIDIA Corporation, Santa Clara, CA (US)

(*) Notice: Subject to any disclaimer, the term of this patent is extended or adjusted under 35 U.S.C. 154(b) by 424 days.

(21) Appl. No.: 13/778,053

(22) Filed: Feb. 26, 2013

(65) Prior Publication Data

US 2014/0240918 A1    Aug. 28, 2014

(51) Int. Cl.
| | |
|---|---|
| *G06F 1/16* | (2006.01) |
| *H05K 5/00* | (2006.01) |
| *H05K 7/00* | (2006.01) |
| *G06F 1/20* | (2006.01) |
| *H01L 23/427* | (2006.01) |

(52) U.S. Cl.
CPC ............... *G06F 1/20* (2013.01); *H01L 23/427* (2013.01); *G06F 2200/201* (2013.01); *H01L 2224/16225* (2013.01)

(58) Field of Classification Search
CPC .................................... G06F 1/20; G06F 1/206
USPC ............. 361/679.47, 679.53, 679.54, 679.46
See application file for complete search history.

(56) References Cited

U.S. PATENT DOCUMENTS

| | | | |
|---|---|---|---|
| 6,237,223 B1 | 5/2001 | McCullough | |
| 7,134,289 B2* | 11/2006 | Patel | F25B 23/006 257/E23.1 |
| 7,369,410 B2* | 5/2008 | Chen | F28D 15/0233 165/104.21 |
| 8,873,237 B2* | 10/2014 | Stefanoski | 361/710 |
| 8,934,235 B2* | 1/2015 | Rubenstein et al. | 361/679.47 |
| 2002/0056908 A1 | 5/2002 | Brownell et al. | |
| 2003/0183373 A1 | 10/2003 | Sarraf et al. | |
| 2005/0022975 A1* | 2/2005 | Rosenfeld et al. | 165/104.11 |
| 2006/0039111 A1* | 2/2006 | Huang | H01L 23/427 361/698 |
| 2008/0170368 A1 | 7/2008 | Chen et al. | |
| 2009/0001560 A1* | 1/2009 | Stefanoski | 257/714 |
| 2010/0302725 A1* | 12/2010 | Busch | 361/679.47 |

OTHER PUBLICATIONS

Office Action from German Patent Application No. 10 2013 114 600.7, dated Sep. 11, 2015.

* cited by examiner

*Primary Examiner* — Anthony Haughton
(74) *Attorney, Agent, or Firm* — Zilka-Kotab, PC

(57) ABSTRACT

A cooling subsystem is provided for dissipating heat from processor. The cooling subsystem includes a heat sink comprising an upper portion having a plurality of fins formed therein and a base portion fixed to the upper portion to form a vapor chamber in an enclosed volume between the upper portion and the base portion.

16 Claims, 6 Drawing Sheets

HEAT SINK WITH AN INTEGRATED VAPOR CHAMBER

FIELD OF THE INVENTION

The present invention relates to cooling systems, and more particularly to heat sinks in electronic systems.

BACKGROUND

High power electronic components such as central processing units and graphics processing units generate a large amount of heat during operation. The heat needs to be dissipated to avoid overheating the component. Conventional cooling solutions include placing a heat sink or heat pipe in contact with a surface of the component, which draws heat away from the electronic component via conduction. The heat is then dissipated by convection, possibly in conjunction with one or more fans that force air over the heat sink or heat pipe.

One particular heat sink technology in recent use implements a heat sink with a stacked fin assembly soldered thereto. The base of the heat sink may or may not include a heat pipe integrated therein. The base of the heat sink may also incorporate a vapor chamber inside the base that efficiently transfers heat between a bottom surface of the base and a top surface of the base, which is in contact with a bottom surface of the stacked fin assembly.

Efficient cooling solutions enable electronic components to operate at higher speeds, thereby making the overall system more efficient. Processors may be operated in conditions that result in higher performance if heat sink efficiency is increased thereby cooling the processor more effectively. However, conventional heat sink designs are limited by the thermal transfer properties of the materials as well as other aspects of the designs. Thus, there is a need for addressing this issue and/or other issues associated with the prior art.

SUMMARY

A cooling subsystem is provided for dissipating heat from a processor. The cooling subsystem includes a heat sink comprising an upper portion having a plurality of fins formed therein and a base portion fixed to the upper portion to form a vapor chamber in an enclosed volume between the upper portion and the base portion.

DETAILED DESCRIPTION

Figure 1A:
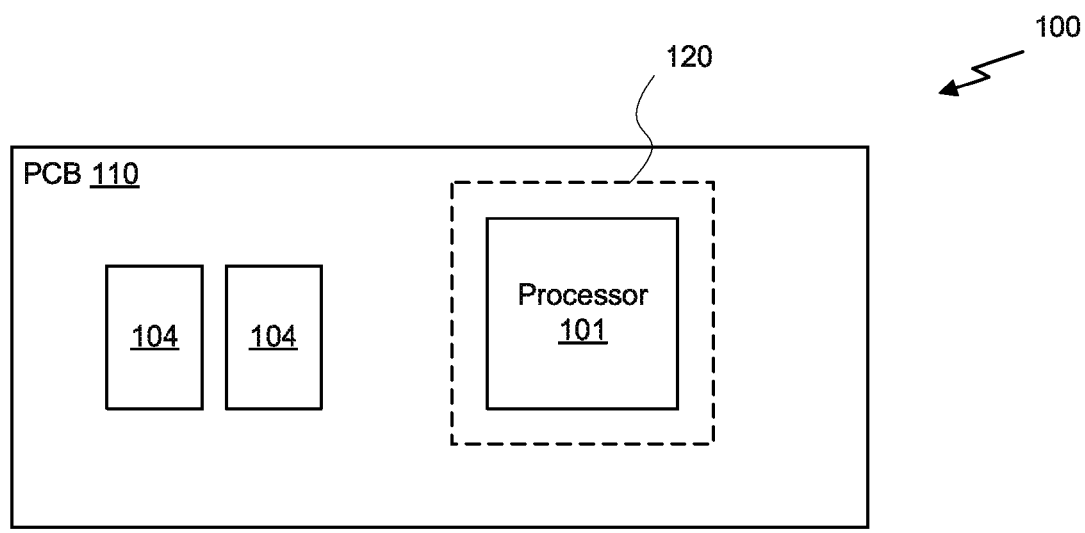
FIGS. 1A & 1B illustrate a system including a heat sink that is included in a cooling subsystem, in accordance with one embodiment.
Figure 1B:
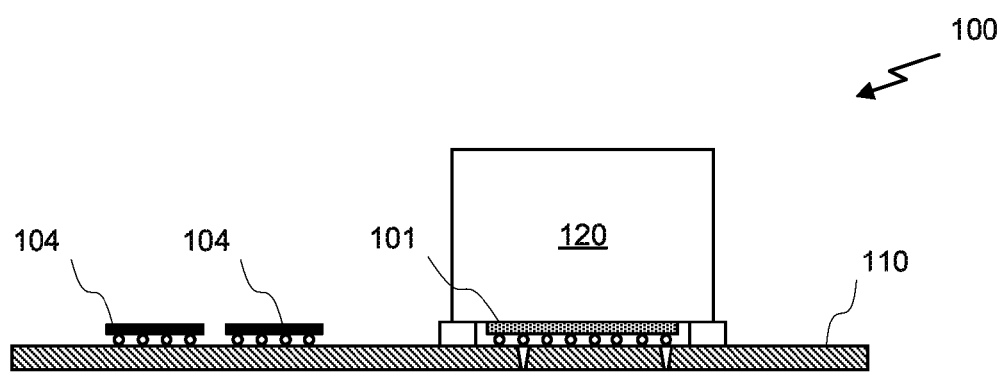

FIGS. 1A & 1B illustrate a system 100 including a heat sink 120 that is included in a cooling subsystem, in accordance with one embodiment. As shown in FIG. 1A, the system 100 includes a printed circuit board (PCB) 110 populated with one or more electronic components coupled thereto, such as a processor 101. In the context of the present description, an electronic component may include a central processing unit, a graphics processing unit, a System-on-Chip (SoC), an application specific integrated circuit (ASIC), or some other type of high-power device. It should be noted that, while various optional features are set forth herein in connection with the system 100, such features are set forth for illustrative purposes only and should not be construed as limiting in any manner.

For example, in the context of the exemplary embodiment illustrated in FIG. 1A, the system 100 may or may not include one or more memory modules 104 coupled to the processor 101. It will be appreciated that the electronic components populated on the PCB 110 are optional and other components may be included in addition to or in lieu of the components shown in FIG. 1A. For example, the PCB 110 may include a voltage regulator, a co-processor, additional memory modules, capacitors, resistors, and an interface such as a JTAG (Joint Test Action Group) interface, a USB (Universal Serial Bus) interface, or a PCIe (Peripheral Component Interconnect Express) interface.

In order to dissipate heat from the processor 101 or other device, a heat sink 120 is placed on top of the processor 101. The heat sink 120 is made of aluminum, copper, or other material with good thermal transfer properties. The heat sink 120 may include fins or other structures that increase the surface area of the heat sink 120 to allow for better thermal transfer due to convection. The heat sink 120 may include an integrated fan assembly (not shown) that increases the air flow over the surface of the heat sink 120.

As shown in FIG. 1B, the processor 101 is included in a plastic package and is connected to the PCB 110 via a ball-grid-array (BGA) located on the bottom surface of the package. In addition, the memory modules 104 are also connected to the PCB 110 via a BGA. Although the connections shown in FIG. 1B are implemented via BGA type packages, it will be appreciated that the electrical components connected to the PCB 100 may be connected via other technologies such as through-hole technology, dual-in-line packages (e.g., Small-Outline Integrated Circuits or SOIC; Thin Small-Outline Package or TSOP; etc.), quad-in-line packages (e.g., Low-profile Quad Flat Package or LQFP; Plastic Leaded Chip Carrier or PLCC; etc.), and grid arrays (e.g., Pin Grid Array or PGA; Fine-pitch Ball Grid Array or FBGA; etc.), among other package types.

In one embodiment, the system 100 may be implemented as an add-in card configured to interface with a slot of a motherboard in a personal computer (PC) or laptop. For example, the system 100 may be a graphics card that includes a graphics processing unit and graphics memory. The graphics card may render high quality 3D graphics to be displayed on a display device connected to the PC. The graphics card may include a cooling subsystem that includes the heat sink 120 and a fan.

Figure 2:
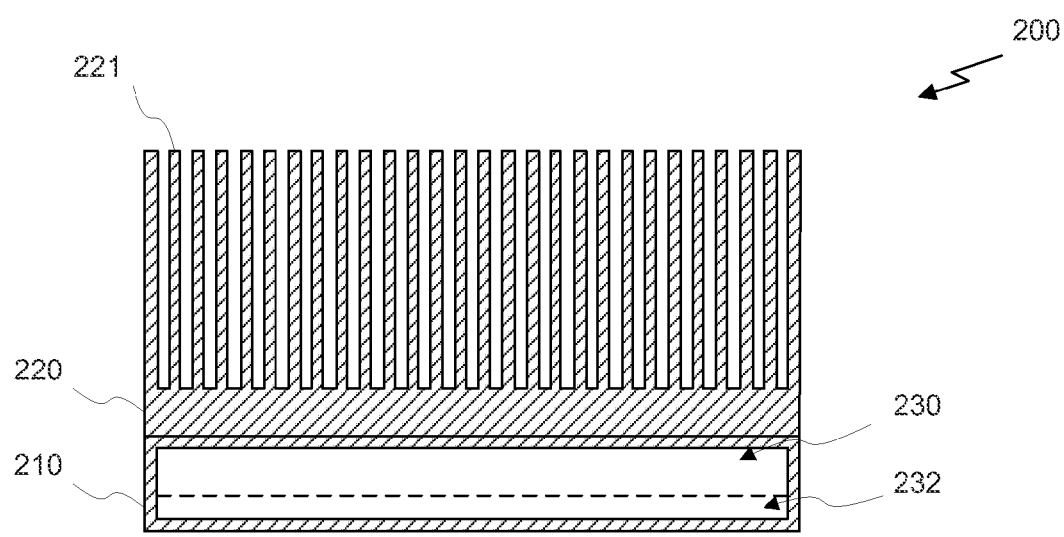
FIG. 2 illustrates a heat sink with integrated vapor chamber, in accordance with the prior art.

FIG. 2 illustrates a heat sink 200 with integrated vapor chamber 230, in accordance with the prior art. As shown in FIG. 2, the heat sink 200 comprises a base portion 210 and an upper portion 220. Typically, the base portion 210 is manufactured separately from the upper portion 220, and then the upper portion 220 is soldered or otherwise mated with the base portion 210 such that fins in the upper portion 210 are separate and distinct from the base portion which includes the vapor chamber 230. The base portion 210 and the upper portion 220 may be manufactured from a metallic material such as copper, aluminum, copper alloys, aluminum alloys, or some other type of material with good thermal transfer properties. The upper portion 220 includes a plurality of fins 221 formed therein to increase the effectiveness of the heat sink 200. The fins 221 increase the surface area of the upper portion 220 of the heat sink 200 increasing the effectiveness of heat transfer between the upper portion 220 and the surrounding air via convection.

The base portion 210 of the heat sink 200 includes a vapor chamber 230 formed therein. The vapor chamber 230 is an enclosed volume inside the base portion 210 that contains a pool of liquid 232. The pool of liquid 232 may be distilled water, isopropyl alcohol, a coolant, or some other type of liquid including a solution of one or more liquids and/or one or more soluble solids. As is known in the art, as the processor 101 heats up the bottom surface of the base portion 210, the liquid is heated and changes from a liquid to a vapor. The vapor rises to the top of the vapor chamber 230 where the vapor is cooled by contact with the top surface of the vapor chamber 230. The top surface of the vapor chamber 230 may be cooler than the boiling point of the liquid due to heat dissipation of the fins 221 in the upper portion 220 of the heat sink 200. The cooled vapor condenses back to a liquid and returns to the pool of liquid 232 to be reheated by the heat generated by the processor 101.

The vapor chamber 230 effectively distributes the heat across the entire volume of the base portion 210 of the heat sink 200. The base portion 210 will remain at or below the boiling temperature of the pool of liquid 232 as long as at least a portion of the liquid is in a liquid state. In addition, the vapor formed from a portion of the pool of liquid 232 that has boiled evenly distributes the heat from the processor 101 across the volume of the base portion 210 such that the temperature of the base portion 210 is substantially uniform. In conventional heat sinks without an integrated vapor chamber, the volume of the heat sink will experience a temperature gradient from a high temperature at the contact surface of the heat source to a lower temperature further away from the contact surface. Because the efficiency of heat transfer due to convection is dependent on the temperature gradient between the surface and the air, the higher the temperature in the fins of the heat sink, the more efficient the heat sink is at dissipating thermal energy. The vapor chamber 230 effectively raises the temperature at the fins of the heat sink because there is little temperature gradient across the base portion of the heat sink 200.

Figure 3:
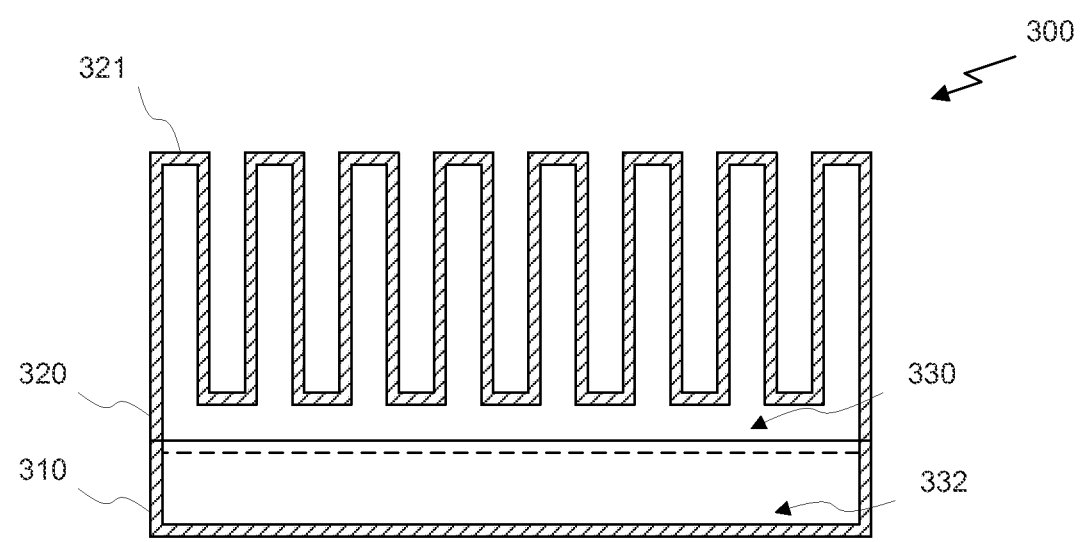
FIG. 3 illustrates a heat sink with an integrated vapor chamber, in accordance with one embodiment.

FIG. 3 illustrates a heat sink 300 with an integrated vapor chamber 330, in accordance with one embodiment. The heat sink 300 may be used in the system 100 of FIG. 1 in lieu of the heat sink 120 and may or may not include an integrated fan assembly configured to force air over a plurality of fins 321 in heat sink 300. As shown in FIG. 3, the heat sink 300 comprises a base portion 310 and an upper portion 320. The base portion 310 may be manufactured separately from the upper portion 320, and then the upper portion 320 is soldered or otherwise mated with the base portion 310 around a perimeter of the base portion 310 thereby forming a vapor chamber 330 between the base portion 310 and the upper portion 320. The base portion 310 and the upper portion 320 may be manufactured from a metallic material such as copper, aluminum, copper alloys, aluminum alloys, or some other type of material with good thermal transfer properties. The upper portion 320 includes a plurality of fins 321 formed therein to increase the effectiveness of the heat sink 300. The fins 321 increase the surface area of the upper portion 320 of the heat sink 300 such that more heat can be transferred to surrounding air via convection. Although not shown explicitly, the heat sink 300 may include a flange along the lower edge of the base 310 having a plurality of holes formed therein to mount the heat sink to a printed circuit board 110. The flange may also provide a surface on which a clip may press to mount the heat sink to the printed circuit board 110. It will be appreciated that any mounting system for mounting the heat sink 300 to the printed circuit board 110, as is known in the art, may be used in system 100 and is within the scope of the present disclosure. For example, a pedestal or seat may be mounted to the printed circuit board 110 that provides a mounting interface for the heat sink 300.

Similar to the heat sink 200 of FIG. 2, the base portion 310 of the heat sink 300 includes a vapor chamber 330 formed therein. However, the vapor chamber 330 is not fully enclosed within the base portion 310 like in heat sink 200. The upper portion 320 of the heat sink 300 also includes a volume included in an interior portion of the fins 321 that comprises a portion of the vapor chamber 330. The base portion 310 may be mated with the upper portion 320 by soldering around a perimeter of the base portion 310 and the upper portion 320. When the base portion 310 is mated with the upper portion 320, the vapor chamber 330 is an enclosed volume therein that contains a pool of liquid 332. The pool of liquid 332 may be distilled water, isopropyl alcohol, a coolant, or some other type of liquid including a solution of one or more liquids and/or one or more soluble solids. The pool of liquid 332 contained in the vapor chamber 330 may be larger than the pool of liquid 232 contained within the vapor chamber 230 where the volume of base portion 210 is similar to the volume of base portion 310. The pool of liquid 332 may include more liquid because the volume of vapor chamber 330 is larger than the volume of vapor chamber 230 due to the interior volume of the upper portion 320.

As shown in FIG. 3, the fins 321 of the heat sink 300 are thicker than the fins 221 of the heat sink 200 of FIG. 2. The fins 321 have a wall thickness and an enclosed volume fluidly connected to the vapor chamber 330 such that vapor (e.g., steam) formed from the boiled liquid may flow into the enclosed volume in the fins 321. The heat is transferred from the vapor to the interior surface of the fins 321, where the vapor condenses back into a liquid and flows down the sides of the fins and back to the pool of liquid 332. In one embodiment, the wall thickness is approximately equal to the thickness of the fins 221 of a conventional heat sink 200 (e.g., 1 mm). The thickness of the enclosed volume may be approximately equal to the wall thickness as well. Thus, the fins 321 may be approximately three times as thick as the fins 221 of the conventional heat sink 200. In another embodiment, the thickness of the fins 321 may be optimized for performance, such as having fins with non-uniform thickness across the height of the heat sink 300 or having a width of the enclosed volume within the fins that is not equal to the wall thickness of the fins.

As the processor 101 heats up the bottom surface of the base portion 310 of the heat sink 300, the liquid in the pool of liquid 332 is heated and changes from a liquid to a vapor. The vapor rises to the enclosed volume within the fins 321 where the vapor is cooled by contact with the interior surface of the fins 321 as heat is dissipated by the heat sink 300 via convection. The cooled vapor condenses back to a liquid and returns to the pool of liquid 332 to be reheated by the heat generated by the processor 101.

Figure 4A:
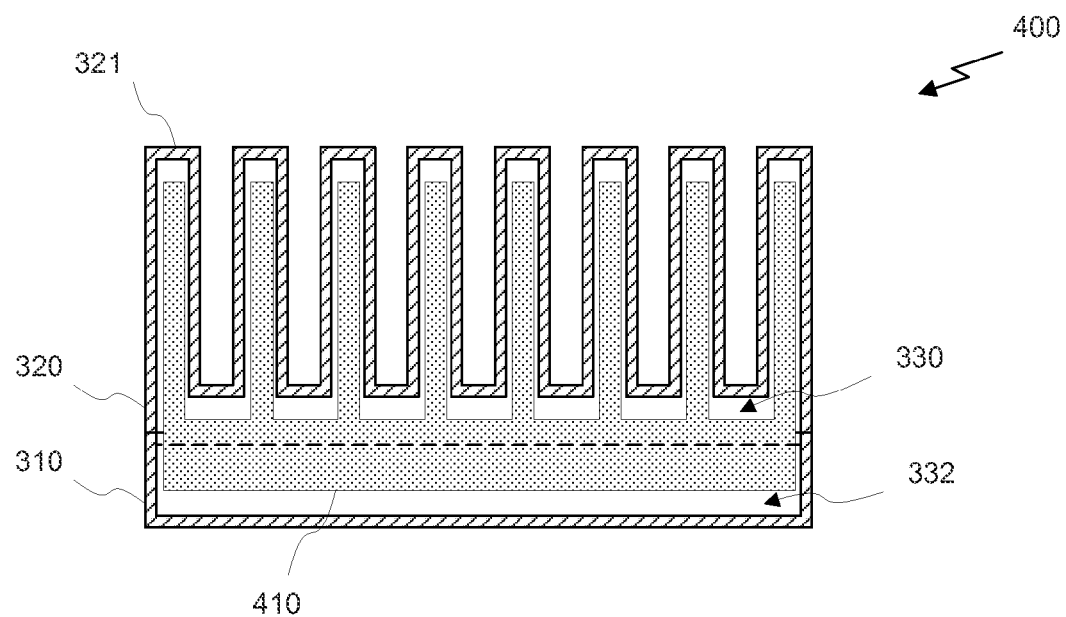
FIG. 4A illustrates a heat sink with an integrated vapor chamber, in accordance with another embodiment.

FIG. 4A illustrates a heat sink 400 with an integrated vapor chamber, in accordance with another embodiment. The heat sink 400 may be used in the system 100 of FIG. 1 in lieu of the heat sink 120 and may or may not include an integrated fan assembly configured to force air over a plurality of fins 321 in heat sink 400. As shown in FIG. 4, the heat sink 400 is similar to heat sink 300 of FIG. 3. However, the heat sink 400 includes a wick structure 410 that helps direct condensed liquid from the fins 321 back to the pool of liquid 332. In one embodiment, the wick structure 410 is a wire mesh. In another embodiment, the wick structure 410 is a porous, sintered metal powder such as copper. In yet another embodiment, the wick structure 410 comprises a plurality of grooves formed in the surface of the fins 321. The wick structure 410 enables vapor to flow around and/or through the wick structure into the fins 321 while also enabling liquid to flow back to the pool of liquid 332 in the base portion 310. The liquid is drawn back to the pool of liquid 332 via capillary action.

Both heat sink 300 and heat sink 400 offer high thermal conductivity that, in operation, generates a more uniform temperature over the surface of the fins 321 than comparable solid fins 221. The increased volume of the vapor chamber 330 enables more liquid to be included in the vapor chamber of similarly sized conventional heat sinks, thereby increasing the cooling capacity of the heat sink. Having a vapor chamber inside the fins 321 results in a more uniform fin 321 temperature. Again, due to the dependence of convective heat transfer on a temperature gradient between the surface and the air, distributing the heat more uniformly over the surface of the fins 321 increases the efficiency of the heat sinks 300 and 400.

Figure 4B:
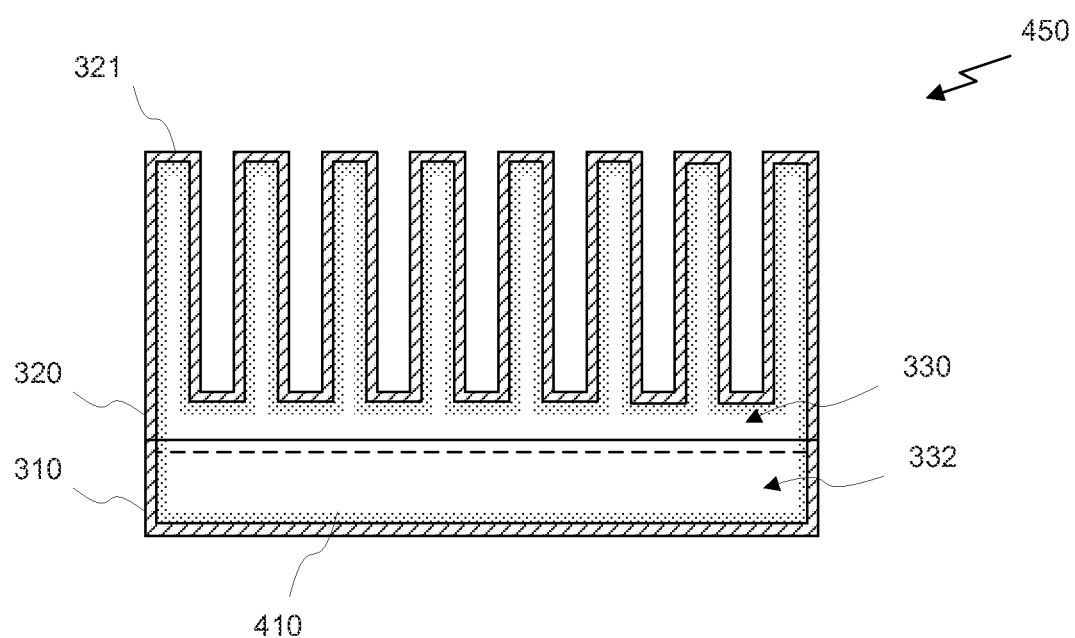
FIG. 4B illustrates a heat sink with an integrated vapor chamber, in accordance with yet another embodiment.

FIG. 4B illustrates a heat sink 450 with an integrated vapor chamber, in accordance with yet another embodiment. The heat sink 450 is similar to heat sink 400 of FIG. 4A except with a different wick structure 410. As shown in FIG. 4B, the heat sink 450 includes a wick structure 410 that helps direct condensed liquid from the fins 321 back to the pool of liquid 332. The wick structure 410 may be a porous, sintered metal powder such as copper that is formed on the inner surface of the base portion 310 and the upper portion 320 of the heat sink 450. In another embodiment, the wick structure 410 is a series of grooves or raised ribs that help direct the flow of condensed vapor back to the pool of liquid 332. It will be appreciated that the wick structure 410 may be any material or structural feature capable of exerting a capillary force on the condensed liquid that causes the liquid to wick back to the source of heat.

Figure 5:
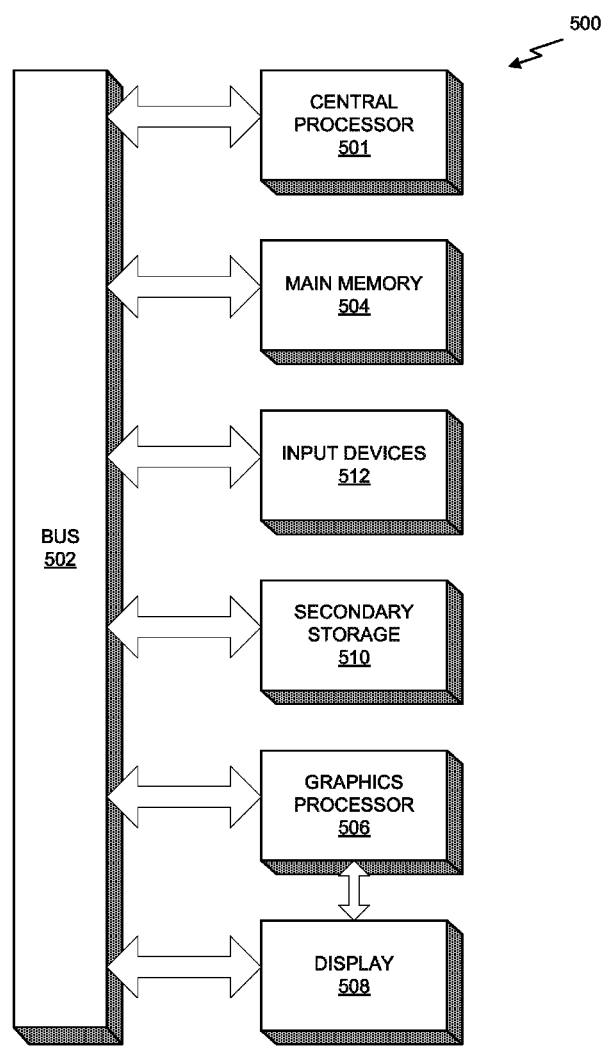
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one central processor 501 that is connected to a communication bus 502. The communication bus 502 may be implemented using any suitable protocol, such as PCI (Peripheral Component Interconnect), PCI-Express, AGP (Accelerated Graphics Port), HyperTransport, or any other bus or point-to-point communication protocol(s). The system 500 also includes a main memory 504. Control logic (software) and data are stored in the main memory 504 which may take the form of random access memory (RAM).

The system 500 also includes input devices 512, a graphics processor 506, and a display 508, i.e. a conventional CRT (cathode ray tube), LCD (liquid crystal display), LED (light emitting diode), plasma display or the like. User input may be received from the input devices 512, e.g., keyboard, mouse, touchpad, microphone, and the like. In one embodiment, the graphics processor 506 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 500 may also include a secondary storage 510. The secondary storage 510 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 504 and/or the secondary storage 510. Such computer programs, when executed, enable the system 500 to perform various functions. The memory 504, the storage 510, and/or any other storage are possible examples of computer-readable media.

In one embodiment, the architecture and/or functionality of the various previous figures may be implemented in the context of the central processor 501, the graphics processor 506, an integrated circuit (not shown) that is capable of at least a portion of the capabilities of both the central processor 501 and the graphics processor 506, a chipset (i.e., a group of integrated circuits designed to work and sold as a unit for performing related functions, etc.), and/or any other integrated circuit for that matter. For example, a motherboard that includes the central processor 501 or the graphics processor 506 may implement a cooling subsystem that includes the heat sinks 300 or 400 set forth above.

Still yet, the architecture and/or functionality of the various previous figures may be implemented in the context of a general computer system, a circuit board system, a game console system dedicated for entertainment purposes, an application-specific system, and/or any other desired system. For example, the system 500 may take the form of a desktop computer, laptop computer, server, workstation, game consoles, embedded system, and/or any other type of logic. Still yet, the system 500 may take the form of various other devices including, but not limited to a personal digital assistant (PDA) device, a mobile phone device, a television, etc.

Further, while not shown, the system 500 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A heat sink comprising:
an upper portion having a plurality of fins formed therein; and a base portion fixed to the upper portion to form a vapor chamber in an enclosed volume between the upper portion and the base portion, wherein the vapor chamber comprises an interior volume of at least one of the fins in the plurality of fins, wherein a bottom surface of the base portion contacts a processor such that heat generated by the processor is transferred through the base portion to a pool of liquid contained within the vapor chamber.

2. The heat sink of claim 1, wherein the pool of liquid comprises a liquid selected from the group of water, ethanol, methanol, and ammonia.

3. The heat sink of claim 1, wherein the upper portion and the base portion are formed from copper or a copper alloy.

4. The heat sink of claim 1, wherein the upper portion and the base portion are formed from aluminum or an aluminum alloy.

5. The heat sink of claim 1, further comprising a wick structure.

6. The heat sink of claim 5, wherein the wick structure comprises a wire mesh.

7. The heat sink of claim 5, wherein the wick structure comprises a sintered metal powder.

8. The heat sink of claim 5, wherein the wick structure comprises a plurality of grooves formed on an interior surface of the fins.

9. A system, comprising:
a processor; and
a heat sink comprising:
an upper portion having a plurality of fins formed therein, and
a base portion fixed to the upper portion to form a vapor chamber in an enclosed volume between the upper portion and the base portion,
wherein the vapor chamber comprises an interior volume of at least one of the fins in the plurality of fins,
wherein a bottom surface of the base portion contacts the processor such that heat generated by the processor is transferred through the base portion to a pool of liquid contained within the vapor chamber.

10. The system of claim 9, wherein the pool of liquid comprises a liquid selected from the group of water, ethanol, methanol, and ammonia.

11. The system of claim 9, further comprising a fan configured to force air across the plurality of fins.

12. The system of claim 9, the heat sink further comprising a wick structure.

13. The system of claim 12, wherein the wick structure comprises a sintered metal powder.

14. The system of claim 9, wherein the processor is a graphics processing unit.

15. The system of claim 9, wherein the heat sink and the processor are included on an add-in card configured to interface with a slot of a motherboard.

16. The system of claim 9, further comprising:
a graphics processor; and
a second heat sink comprising:
an upper portion having a plurality of fins formed therein, and
a base portion fixed to the upper portion to form a vapor chamber in an enclosed volume between the upper portion and the base portion,
wherein the heat sink is thermally coupled to the processor and the second heat sink is thermally coupled to the graphics processor, and
wherein the vapor chamber in the second heat sink comprises an interior volume of at least one of the fins in the plurality of fins formed in the upper portion of the second heat sink.

* * * * *